United States Patent
Arnz et al.

(10) Patent No.: US 8,693,805 B2
(45) Date of Patent: Apr. 8, 2014

(54) DETERMINATION OF THE RELATIVE POSITION OF TWO STRUCTURES

(75) Inventors: Michael Arnz, Oberkochen (DE); Dirk Seidel, Jena (DE)

(73) Assignee: Carl Zeiss SMS GmbH, Jena (DE)

( * ) Notice: Subject to any disclaimer, the term of this patent is extended or adjusted under 35 U.S.C. 154(b) by 138 days.

(21) Appl. No.: 13/375,830

(22) PCT Filed: Jul. 23, 2010

(86) PCT No.: PCT/EP2010/004517
§ 371 (c)(1),
(2), (4) Date: Dec. 2, 2011

(87) PCT Pub. No.: WO2011/012265
PCT Pub. Date: Feb. 3, 2011

(65) Prior Publication Data
US 2012/0121205 A1 May 17, 2012

Related U.S. Application Data

(60) Provisional application No. 61/229,843, filed on Jul. 30, 2009.

(30) Foreign Application Priority Data

Jul. 30, 2009 (DE) .......................... 10 2009 035 290

(51) Int. Cl.
*G06K 9/36* (2006.01)
*G06K 9/20* (2006.01)
*G06K 9/32* (2006.01)

(52) U.S. Cl.
USPC ............................ 382/283; 382/291; 382/294

(58) Field of Classification Search
CPC ... G03F 7/70633; G03F 7/70625; G03F 3/06; G06T 11/00; H04N 1/3872
USPC ............ 382/144, 283, 291, 294, 295; 430/22; 356/426; 438/14
See application file for complete search history.

(56) References Cited

U.S. PATENT DOCUMENTS 7,274,814 B2 * 9/2007 Ghinovker et al. ............ 382/144
7,379,184 B2 * 5/2008 Smith et al. .................... 356/401

(Continued)

FOREIGN PATENT DOCUMENTS

DE 102007033815 A1 11/2008
EP 044450 A1 9/1991

OTHER PUBLICATIONS

International Search Report dated Oct. 26, 2010 for PCT/EP2010/004517.

(Continued)

*Primary Examiner* — Kanjibhai Patel
(74) *Attorney, Agent, or Firm* — Fish & Richardson P.C.

(57) ABSTRACT

A method is provided for determining the position of a first structure (8a) relative to a second structure (8b) or a part thereof, said method having the steps of: a) providing a first picture (F1) having a multiplicity of pixels and which contains the first structure, b) providing a second picture (F2) having a multiplicity of pixels and which contains the second structure, c) forming an optimization function with the displacement of the two pictures relative to one another as parameter, the optimization function overlying the two pictures and masking the overlay such that in a determination of an extreme value of the optimization function a contribution is made only by the region of the overlay that corresponds to the second structure or the part thereof, d) ascertaining the extreme value of the optimization function and determining the optimal value of the displacement based on the extreme value of the optimization function, and e) determining the position of the first structure relative to the second structure or a part thereof with the optimal displacement value ascertained in step d).

21 Claims, 5 Drawing Sheets

(56) References Cited

U.S. PATENT DOCUMENTS

| | | | |
|---|---|---|---|
| 7,477,396 B2 * | 1/2009 | Smith et al. | 356/445 |
| 7,626,702 B2 * | 12/2009 | Ausschnitt et al. | 356/401 |
| 7,666,559 B2 * | 2/2010 | Schulz | 430/22 |
| 7,667,842 B2 * | 2/2010 | Schulz | 356/401 |
| 7,671,990 B1 * | 3/2010 | Adel et al. | 356/400 |
| 7,842,442 B2 * | 11/2010 | Seltmann et al. | 430/22 |
| 7,847,939 B2 * | 12/2010 | Smith et al. | 356/401 |
| 7,879,627 B2 * | 2/2011 | Ghinovker et al. | 438/14 |
| 2002/0199164 A1 | 12/2002 | Sengupta et al. | |
| 2003/0160627 A1 | 8/2003 | Muradian et al. | |
| 2004/0038455 A1 | 2/2004 | Seligson et al. | |
| 2006/0204073 A1 | 9/2006 | Ghinovker et al. | |

OTHER PUBLICATIONS

German Search Report dated Jun. 30, 2010 for DE 10 2009 035 290.2.

* cited by examiner

DETERMINATION OF THE RELATIVE POSITION OF TWO STRUCTURES

CROSS REFERENCE TO RELATED APPLICATIONS

This application is the National Stage of International Application No. PCT/EP2010/004517, filed on Jul. 23, 2010, which claims priority to German Application No. 10 2009 035 290.2, filed on Jul. 30, 2009, and U.S. Provisional Patent Application Ser. No. 61/229,843, filed on Jul. 30, 2009. The contents of the above applications are incorporated by reference in their entireties.

The present invention relates to a method and a device for determining the position of a first structure relative to a second structure or a part thereof.

DE 10 2007 033 815 A1 discloses a method for determining the relative overlay displacement of superposed layers in which, in accordance with claim 1 of this publication, the reference image or measurement image is always weighted such that the first or second pattern element is amplified relative to the other pattern element, and then the relative displacement of the corresponding pattern element is ascertained with the aid of the weighted image and the non-weighted measurement image or reference image. Since cross correlation is carried out when ascertaining this, instabilities introduced in the weighting would have the effect of rendering it impossible to ascertain the relative displacement accurately. Consequently, in accordance with section No. 45 on page 4 of DE 10 2007 033 815 A1 the weighting is carried out as far as possible such that no additional instabilities are introduced in the color profile.

Specifically, additional instabilities would have the effect that the Fourier spectrum of the weighted reference image or measurement image would no longer be of limited bandwidth, and so it is no longer possible to determine the position with desired accuracy by means of cross correlation. FIG. 11 is a schematic of a double star structure 20 whose Fourier spectrum is plainly of limited spectral bandwidth in accordance with the schematic in FIG. 12.

If, now, the inner star 21 of the double star structure 20 is masked, as illustrated in FIG. 13, this introduces an instability the consequence of which is that the Fourier spectrum is no longer of limited bandwidth, as illustrated schematically in FIG. 14.

The limitation that no additional instabilities may be introduced in weighting, disadvantageously has the consequence that the method known from DE 10 2007 033 815 A1 cannot be transferred to closely juxtaposed pattern elements with spacings of less than λ/NA (λ=wavelength of the light with which the picture is taken, and NA=numerical aperture of the recording optics) cannot be transferred, furthermore, to other measurement tasks in metrology such as, for example, the measurement of linewidths. The primary reason why the method known from DE 10 2007 033 815 A1 cannot be solved by measuring edge positions, and thus linewidths, is that the homogeneity of the intensity on the edge trajectory of the weighting is not ensured for this measurement task, and so the simple approach of cross correlation no longer functions. Rather, in the case of edge measurements there is always present within the weighting a light/dark transition as a consequence of which the intensity at two opposite edges of the weighting differs significantly.

This light/dark transition is illustrated schematically in FIGS. 15 and 16. FIG. 15 shows a cross structure 23 whose edge position in the region 24 is to be measured, for which reason this region 24 is masked. The masked region 24 is illustrated in an enlarged fashion in FIG. 16. It is clearly to be seen from this illustration that a light edge is present at the right-hand edge 25, whereas a dark edge is present at the left-hand edge 26, such that the undesired light/dark transition is given at two opposite edges of the weighting 24.

It is thus an object of the invention starting herefrom to provide a method for determining the position of a first structure relative to a second structure or a part thereof that has a high accuracy and can be used flexibly. It is, furthermore, intended to provide an appropriate device for determining the position of a first structure relative to a second structure or a part thereof.

The object is achieved by a method for determining the position of a first structure relative to a second structure or a part thereof, having the steps of:

a) providing a first picture having a multiplicity of pixels and which contains the first structure, b) providing a second picture having a multiplicity of pixels and which contains the second structure, c) forming an optimization function with the displacement of the two pictures relative to one another as parameter, the optimization function overlying the two pictures and masking the overlay such that in a determination of an extreme value of the optimization function a contribution is made only by the region of the overlay that corresponds to the second structure or the part thereof, d) ascertaining the extreme value of the optimization function and determining the optimal value of the displacement based on the extreme value of the optimization function, and e) determining the position of the first structure relative to the second structure or a part thereof with the optimal displacement value ascertained in step d).

The masking gives rise to a keyhole effect resulting in the fact that only the masked region of the overlay of the two pictures is taken into account in determining the extreme value in step d). In accordance with step c), the masked region is thus selected such that the second structure or the part thereof lies in the overlay in said step, and such that the optimization function is always used to carry out a comparison of the second structure or of the part thereof with the first picture, which is displaced thereto in a preferably stepwise (in particular subpixelwise fashion), in which case, of course, during the extreme value determination the masking takes account only of the region of the first picture lying within the masking.

With the aid of the inventive method, it is possible for pattern elements of the first structure that are very closely juxtaposed and whose spacing is, for example, less than λ/NA to be separated by the masking, and/or to mask edges of the second structure and to determine their relative position with high accuracy such that it is possible to ascertain linewidths, for example.

In the case of the inventive method, the optimization function in accordance with step c) can sum the squared difference of the brightness values of the two pictures in a weighted fashion over all the pixels, the weighting being selected such that the masking of the region corresponding to the second structure or the part thereof is effected in the overlay. The desired relative position can be ascertained with a very high accuracy, in particular subpixel accuracy, with the aid of such an optimization function.

It is preferably possible in step d) to carry out a stepwise displacement with subpixel steps for extreme value determination. Even in the case of such displacement steps for which the corresponding pixel values of, for example, the displaced first picture are to be determined by interpolation, it is possible to carry out the determination of position with high accuracy.

In particular, in step c) it is possible to form the optimization function such that it has as parameter the displacement of the first picture relative to the second picture. This can be represented particularly well mathematically, and be solved in step d).

The displacement in step c) is, in particular, a cyclic displacement. What is understood here, in particular, as a cyclic displacement is that the image information that is pushed out during the displacement over the edge of, for example, the second picture in the overlay is pushed into the image again on the opposite side.

In particular, the masking is fixed relative to the second picture in the overlay and this, once again, is advantageous in the case of the mathematical representation of the optimization function, as well as what is ascertained in accordance with step d).

The two pictures preferably have the same number of pixels. This simplifies the carrying out of steps c) and d). In particular, in the case of step c) a pixelwise subtraction is carried out such that there is a unique assignment of the pixels of the two pictures for each displacement of the two pictures relative to one another. The two pictures are evaluated pixel by pixel by the optimization function.

The optimization function can have at least one further parameter that is taken into account in step d). This process can comprise, in particular, a different control range or a different dynamic range of the two pictures, a rotation of the two pictures relative to one another and/or a brightness offset of the two pictures.

The two pictures can be derived from different parts of the same picture. However, it is also possible for the two pictures to be separate pictures that were, for example, obtained with the same type of imaging.

The two pictures can respectively be two-dimensional or else three-dimensional pictures, the displacement in accordance with step c) then being a two-dimensional or three-dimensional displacement, respectively. Also possible are pictures of higher dimension in the case of which, for example, further properties (for example, physical properties such as polarization effects, for example) that form further dimensions.

In the case of the inventive method, it is possible before step d) is carried out for the position of the first structure relative to the second structure or a part thereof to be determined with pixel accuracy by means of a conventional method. This relative position determined with pixel accuracy is then used as initial value or starting value for carrying out steps d) and e) in order thus now to carry out determination of position with subpixel accuracy.

Also provided is a device for determining the position of a first structure relative to a second structure or a part thereof, the device having an evaluation module that is provided with a first picture having a multiplicity of pixels and which contains the first structure, and with a second picture having a multiplicity of pixels and which contains the second structure, which evaluation module executes the following steps:
A) forming an optimization function with the displacement of the two pictures relative to one another as parameter, the optimization function overlying the two pictures and masking the overlay such that in a determination of an extreme value of the optimization function a contribution is made only by the region of the overlay that corresponds to the second structure or the part thereof,
B) ascertaining the extreme value of the optimization function and determining the optimal value of the displacement based on the extreme value of the optimization function, and
C) determining the position of the first structure relative to the second structure or a part thereof with the optimal displacement value ascertained in step B).

This device can be used to determine the position of the first structure relative to the second structure or a part thereof with high accuracy.

Developments of the device are specified in the dependent device claims.

The inventive method and the inventive device can be used to determine with high accuracy the relative position of two structures that are, in particular, of identical design. In particular, the determination can be performed with subpixel accuracy, a pixel of the picture corresponding as a rule to a pixel of a corresponding image sensor with the aid of which the structure was recorded.

This inventive determination of position can be used, for example, to determine the overlay displacement and the position of an edge. This determination can be used for metrological measurements, for error analysis, for prepositioning the repair of masks, for example, or for other image analyses and image processing.

It goes without saying that the features specified above and those still to be explained below can be used not only in the specified combinations, but also in other combinations or on their own, without departing from the scope of the present invention.

The invention is explained in yet more detail below by way of example with the aid of the attached drawings, which also disclose features essential to the invention. In the drawings:

FIG. 10 shows a cruciform structure with masking drawn in;

Figure 1:
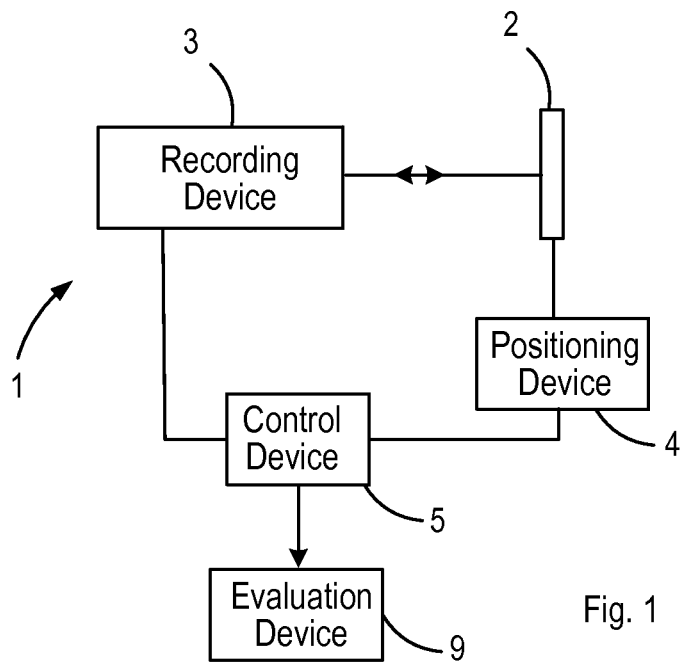
FIG. 1 shows a schematic of an inventive measuring device.

FIG. 1 is a schematic of an inventive measuring device 1 for measuring a lithography mask 2. The measuring device 1 comprises a recording device 3 with the aid of which sections of the lithography mask 2 can be recorded in an enlarged fashion, a positioning device 4 that can set the position of the lithography mask 2 relative to the recording device 3 in a controlled fashion, and a control device 5 for controlling the measuring device 1.

Figure 2:
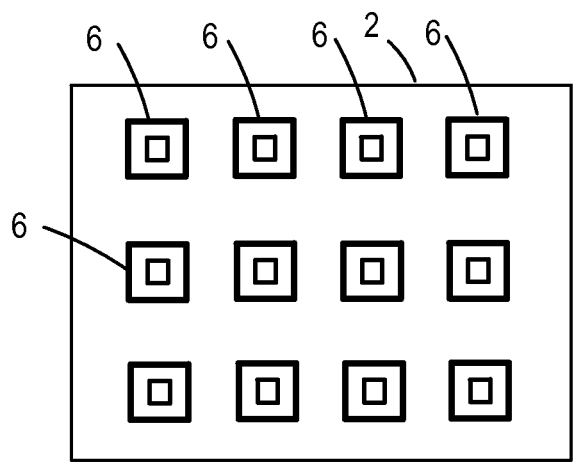
FIG. 2 shows a plan view of the lithography mask 2 from FIG. 1.

The lithography mask 2 is shown schematically in FIG. 2 in a plan view and has a plurality of measurement patterns 6 that are not illustrated in a fashion true to scale, but greatly enlarged. Between the measurement pattern 6, the lithography mask 2 has mask sections that are relevant for the exposure and whose structure is not drawn in here, in order to simplify the illustration.

Figure 3:
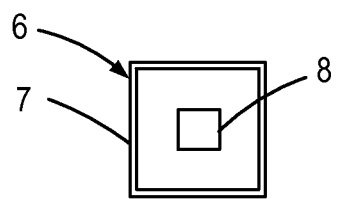
FIG. 3 shows an enlarged view of a measurement pattern 6 of the lithography mask 2.

One of the measurement patterns 6 is illustrated in an enlarged fashion in FIG. 3. As is to be gathered from this illustration, in particular, the measurement pattern 6 comprises a frame 7 in which an inner square 8 lies.

In order to determine the relative position of two neighboring measurement patterns 6, the measurement patterns 6 are recorded one after another by means of the recording device 3, the positioning device 4 moving and positioning the lithography mask 2 for each picture in a highly accurate fashion relative to the recording device 3, which can, for example, have a CCD detector (not shown) for imaging. The image data of the individual pictures are fed to the control device 5, which passes on these data to an inventive evaluation device 9 that can, but need not, be a component of the measuring device.

Figure 4:
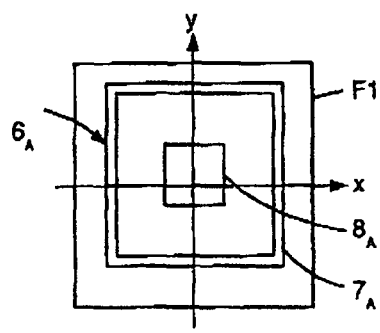
FIG. 4 shows a schematic of a first picture F1.
Figure 5:
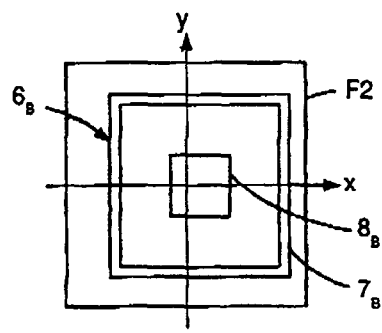
FIG. 5 shows a schematic of a second picture F2.

A first picture F1 of a first measurement pattern $6_A$ is illustrated schematically in FIG. 4, and a second picture F2 of a second measurement pattern $6_B$ is illustrated schematically in FIG. 5.

In order, for example, to now determine the spacing of the two inner squares $8_A$, $8_B$ (first and second structure) of the two measurement patterns $6_A$ and $6_B$, it is necessary to ascertain the relative position of the inner squares $8_A$, $8_B$ in the two measurement patterns $6_A$, $6_B$ in the two pictures F1, F2, such that the absolute spacing of the two inner squares $8_A$, $8_B$ of the two measurement patterns $6_A$ and $6_B$ can be determined with the aid of the relative position in conjunction with the data of the positioning device 4 during recording.

The relative position is determined by means of the method of least squares: the first picture F1 being cyclically displaced relative to the second picture F2, and the weighted sum over all pixels of the squared difference of the intensities of the two pictures F1, F2 being calculated for each displaced position. The displaced position, for which the value thus calculated is an extreme value (as a function of the selection of mathematical sign when calculating a maximum or minimum), corresponds to the best approximation for the relative spacing to be determined.

The sum over all pixels of the squared difference of the intensities of the two pictures F1, F2 corresponds pictorially to the overlay of the two pictures F1, F2, the second picture F2 being fixed here, and the first picture F1 being displaced relative thereto.

The weighting of the summation is now selected such that, as a result, the summation releases the region in the overlay that contains, or corresponds to, the inner square $8_B$ of the second picture F2. A masking is thereby carried out which completely suppresses everything in the overlay apart from the masked region. Consequently, the regions of the first picture that do not lie inside the masking 10 after the appropriate displacement are always completely suppressed in the overlay.

Figure 6A:
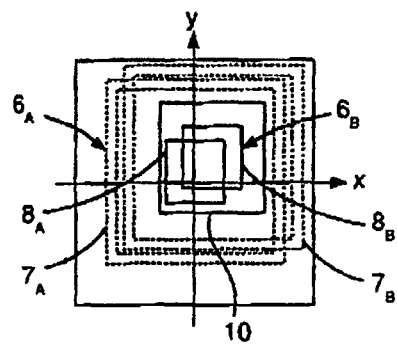
FIGS. 6a, 6b show schematics of different displaced positions of the first picture F1 relative to the second picture F2.
Figure 6B:
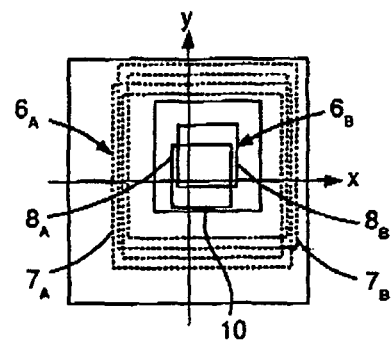

A cyclic displacement is understood here to mean that the image information of the first picture F1, which is pushed out during the displacement over the image edge of the second picture F2 or of the overlay picture, is pushed in again on the respective opposite side of the image edge of the second picture F2 or overlay image. When, for example, a section of the first picture F1 is pushed out over the right-hand edge of the second picture F2 or of the overlay image, this section is pushed into the image again from the left-hand image edge of the second picture F2 or of the overlay image. Two displaced positions of the first picture F1 relative to the second picture F2 are illustrated schematically in FIGS. 6a and 6b, the parts of the measurement patterns $6_A$, $6_B$ not taken into account because of the masking 10 being illustrated by dashes in the overlay image.

As already described above, the invention searches for the displaced position in which the above-described weighted sum, which is also denoted as optimization function below, assumes an extreme value (maximum or minimum). The displacement present in the case of this extreme value is the relative position being sought for the two inner squares $8_A$, $8_B$ in the two measurement patterns $6_A$, $6_B$ in the two pictures F1, F2 so that it is then possible, for example, to use the data of the positioning device 4 to determine the absolute spacing of the squares $8_A$, $8_B$ during recording.

The optimization function M(x,y) can be represented, for example, by the following formula 1:

$$M(x, y) = -\sum_{m=0}^{P-1}\sum_{n=0}^{Q-1} K_{m,n} \cdot [A_{m,n}(x, y) - B_{m,n}]^2 \stackrel{(x,y)}{\rightarrow} \text{maximum} \quad (1)$$

$K_{m,n}$ denoting the normalized 2D masking (also termed keyhole masking or keyhole apodization below) with $$\sum_{m=0}^{P-1}\sum_{n=0}^{Q-1} K_{m,n} = 1,$$

$A_{m,n}$ (x,y) denoting the displaced first picture F1, which is displaced by the vector (−x, −y), and $B_{m,n}$ denoting the second picture. The two pictures are the same size and respectively have P×Q pixels. The summation always subtracts the intensity values of the two pictures from one another these being present in the two pictures at the same pixel position (taking account of the displacement (−x,y)).

Since $B_{m,n}$ is not displaced, and therefore does not depend on the displacement vector (−x,−y), the optimization function can be written as follows:

$$M(x, y) = \qquad (2)$$

$$\sum_{m=0}^{P-1}\sum_{n=0}^{Q-1} K_{m,n} \cdot [2 \cdot A_{m,n}(x, y) \cdot B_{m,n} - A_{m,n}(x, y)^2] \stackrel{(x,y)}{\longrightarrow} \text{maximum}$$

Formula 2 can be written as follows when a spectral decomposition is carried out for the images and the keyhole masking:

$$M(x, y) = \qquad (3)$$

$$\frac{1}{P \cdot Q}\sum_{p,q} \overbrace{[2 \cdot a_{p,q} \cdot \beta^*_{p,q} - \alpha_{p,q} \cdot \kappa^*_{p,q}]}^{=\text{Kernel}_{p,q}} \cdot e^{2\pi i(x \cdot \xi_q + y \cdot \eta_p)} \stackrel{(x,y)}{\rightarrow} \text{maximum}$$

the star (*) specifies here that the corresponding variable is the complex conjugate.

The following spectral decompositions were carried out for the above formula 3:

$$A_{m,n}(x, y) = \frac{1}{P \cdot Q} \sum_{p,q} a_{p,q} \cdot e^{2\pi i([n+x]\cdot\xi_q + [m+y]\cdot\eta_p)} \quad (4)$$

$$A_{m,n}(x, y)^2 = \frac{1}{P \cdot Q} \sum_{p,q} \alpha_{p,q} \cdot e^{2\pi i([n+x]\cdot\xi_q + [m+y]\cdot\eta_p)} \quad (5)$$

$$K_{m,n} \cdot B_{m,n} = \frac{1}{P \cdot Q} \sum_{p,q} \beta_{p,q} \cdot e^{2\pi i(n\cdot\xi_q + m\cdot\eta_p)} \quad (6)$$

$$K_{m,n} = \frac{1}{P \cdot Q} \sum_{p,q} \kappa_{p,q} \cdot e^{2\pi i(n\cdot\xi_q + m\cdot\eta_p)} \quad (7)$$

Furthermore, $\alpha_{p,q}$ denotes the following spectral convolution:

$$\alpha_{p,q} \equiv (a \otimes a)_{p,q} = \frac{1}{P \cdot Q} \sum_{p',q'} a_{p-p', q-q'} \cdot a_{p', q'} \quad (8)$$

and the functions $\xi_q$, $\eta_p$ are defined in accordance with the following formulas 9 and 10

$$\xi_q = \frac{q}{Q} - \mathrm{floor}\left(\frac{q}{Q} + \frac{1}{2}\right); q = 0 \ldots Q-1 \quad (9)$$

$$\eta_p = \frac{p}{P} - \mathrm{floor}\left(\frac{p}{P} + \frac{1}{2}\right); p = 0 \ldots P-1. \quad (10)$$

The function floor renders the largest whole number of the argument that is smaller than or equal to the argument. The relative position of the two patterns can be determined numerically with high precision in this way.

The weighted summation in accordance with the optimization function specified above introduces in the overlay a hard edge that does not, however, cause the absence of bandwidth limitation in the spectral decomposition. Thus, although neither $\beta^*_{p,q}$ nor $\kappa_{p,q}$ is of limited bandwidth, in the difference in accordance with the kernel$_{p,q}$ in formula 3, both the minuend and the subtrahend are of limited bandwidth, since $a_{p,q}$ and $\alpha_{p,q}$ are of limited spectral bandwidth. Owing to the convolution in accordance with formula 8, $\alpha_{p,q}$ certainly has a larger spectral range than $a_{p,q}$, but it is still of limited spectral bandwidth. Thus a numerical solution of Formula 3 which is very accurate is possible. For the rest, the subtrahend $\alpha \cdot \kappa^*$ can be regarded as a term that balances the effect of the leading cross correlation term 2 $\alpha \cdot \beta^*$. Consequently, inhomogeneities in the intensity can be present on the edge trajectory of the weighting, and the inventive method still continues to supply the relative position being sought. In the case of conventional correlation methods, such as those from DE 10 2007 033 815 A1, for example, such edge inhomogeneities have the effect that it is impossible to determine meaningful results.

Figure 15:
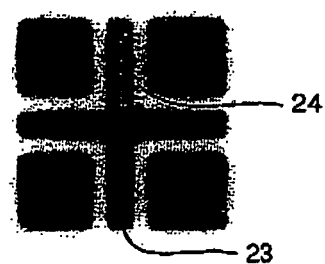
FIG. 15 shows a cruciform structure 23.
Figure 16:
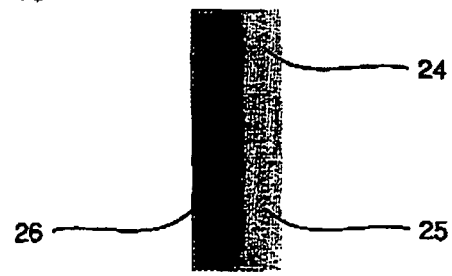
FIG. 16 shows the region 24 of FIG. 15 in an enlarged fashion.

When the relative spacing of the outer frames $7_A$, $7_B$ (which are then the first and second structures in accordance with the present invention) are also determined in the way described (the weighting always suppresses the inner square $8_A$, $8_B$ in this case), it is possible, if the inner squares $8_A$, $8_B$ lie in a first layer, and the frames $7_A$, $7_B$ lie in a second layer, to determine the relative overlay displacement of the two layers from the vector difference of the relative position, thus determined, of the two inner squares $8_A$, $8_B$ and the two frames $7_A$, $7_B$ in the same way as in accordance with FIG. 15 of DE 10 2007 033 815 A1.

It has emerged that not all displaced positions lead to meaningful results, since the optimization function frequently has a plurality of local maxima or minima. Consequently, the position of the first structure relative to the second structure or of a part thereof is determined preferably relatively coarsely by conventional methods. The determination of pixel accuracy, in particular, is understood here as such a relatively coarse determination of position. This relative displacement of position is then used, as it were, as a starting value for the optimization function, in order to ensure that the extrema then found is also the local extrema of the optimization function that is being sought.

Of course, it is also possible to take account of further parameters in the case of this inventive method of least squares with weighting. Thus, for example, as is specified in the following formula 11 it is possible to take account of the different control range of the two images by a further parameter S. Again, it is also possible to take account in addition of a brightness offset of the two pictures relative to one another, as is specified by the parameter T in formula 12. These formulas 11 and 12 can be represented spectrally in the same way as previously described above, and thus be effectively solved numerically.

$$M(x, y, S) = -\sum_{m=0}^{P-1}\sum_{n=0}^{Q-1} K_{m,n} \cdot [A_{m,n}(x, y) - S \cdot B_{m,n}]^2 \overset{(x,y),S}{\to} \mathrm{maximum} \quad (11)$$

$$M(x, y, S, T) = \quad (12)$$
$$-\sum_{m=0}^{P-1}\sum_{n=0}^{Q-1} K_{m,n} \cdot [A_{m,n}(x, y) - S \cdot B_{m,n} - T]^2 \overset{(x,y),S,T}{\to} \mathrm{maximum}$$

The optimization function M in accordance with formulas 11 and 12 can, in turn, (as in formula 3) be represented as follows $$M(x, y) = \frac{1}{P \cdot Q} \sum_{p,q} \mathrm{Kernel}_{p,q} \cdot e^{2\pi i(x\cdot\xi_q + y\cdot\eta_p)} \quad (13)$$

only the kernel$_{p,q}$ differing. Kernel$_{p,q}$ is as follows for formula 11

$$\mathrm{Kernel}_{p,q} = -\alpha_{p,q} \cdot \kappa^*_{p,q} + \left((a \cdot \hat{\beta}^*) \otimes (a \cdot \hat{\beta}^*)\right)_{p,q} \quad (14)$$

the following abbreviated notation having been used in addition to the abbreviations already specified:

$$\hat{B}_{m,n} \equiv \frac{B_{m,n}}{\sqrt{\sum_{m',n'} K_{m',n'} \cdot B^2_{m',n'}}} \quad (15)$$

$$\hat{\beta}_{p,q} \equiv \sum_{m,n} K_{m,n} \cdot \hat{B}_{m,n} \cdot e^{-2\pi i(n\cdot\xi_q + m\cdot\eta_p)} \quad (16)$$

The following representation results for the kernel$_{p,q}$ for formula 12

$$Kernel_{p,q} = -\alpha_{p,q} \cdot \kappa^*_{p,q} + \left(\left(a \cdot \tilde{\beta}^*\right) \otimes \left(a \cdot \tilde{\beta}^*\right)\right)_{p,q} + ((a \cdot \kappa^*) \otimes (a \cdot \kappa^*))_{p,q} \quad (17)$$

the following abbreviations having been used in addition to the abbreviations specified above $$\tilde{B}_{m,n} \equiv \frac{B_{m,n} - \left(\sum_{m',n'} K_{m',n'} \cdot B_{m',n'}\right)}{\sqrt{\left(\sum_{m',n'} K_{m',n'} \cdot B^2_{m',n'}\right) - \left(\sum_{m',n'} K_{m',n'} \cdot B_{m',n'}\right)^2}} \quad (18)$$

$$\tilde{\beta}_{p,q} \equiv \sum_{m,n} K_{m,n} \cdot \tilde{B}_{m,n} \cdot e^{-2\pi i(n \cdot \xi_q + m \cdot \eta_p)} \quad (19)$$

The kernel$_{p,q}$ in formula 14 for M(x,y,S) in accordance with formula 11 can be determined by virtue of the fact that the partial derivative of the optimization function M(x,y,S) with respect to S is set to zero, and this equation is solved for S and substituted in equation 11 such that the optimization for the parameter S is already obtained in the kernel representation.

In the same way, the kernel$_{p,q}$ in formula 17 can be determined for equation 12 by virtue of the fact that the optimization function M(x,y,S,T) in accordance with equation 12 is on the one hand derived partially with respect to S and set to zero, and on the other hand is derived partially with respect to T and set to zero, and the equations for S and T thus obtained are substituted in equation 12.

Figure 7A:
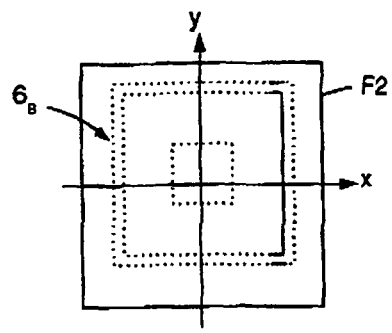
FIGS. 7a, 7b show schematics for the masking of the second picture F2 for determining the linewidth.

The inventive method can also be used to determine the linewidth (CD). For this, the weighting need only be selected such that only the left-hand edge of the right-hand side of the outer square 7 is exposed in the overlay of the second picture F2, as is indicated in FIG. 7a by the continuous lines. The dotted lines indicate which part of the measurement pattern $6_B$ of the second picture is not taken into account because of the masking when the relative position of this exposed edge is ascertained with the aid of the above-described method.

Figure 7B:
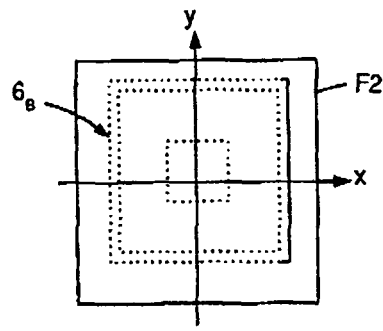

Consequently, the weighting is selected such that only the right-hand edge of the right-hand side of the square 7 is exposed in the overlay, as is indicated in FIG. 7b in the same way as in FIG. 7a. Here, as well, the relative position is determined.

The linewidth of the right-hand edge of the square $7_A$ in the first picture F1 can then be determined from the difference between the two relative positions thus determined, and from the knowledge of the linewidth of the second picture (which can, for example, be determined by using a conventional threshold value method). This linewidth determination is effectively possible since, as already explained above, the instability introduced by the masking is compensated in practice by the second term $\alpha \cdot \kappa^*$ of formula 3 to such an extent that it is possible to determine position numerically with high accuracy.

Figure 8:
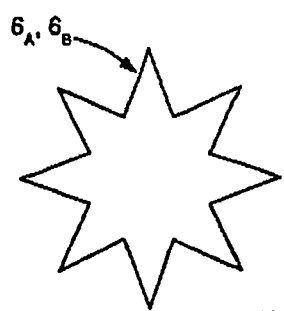
FIGS. 8, 9 show enlarged views of further shapes of the measurement patterns.
Figure 9:
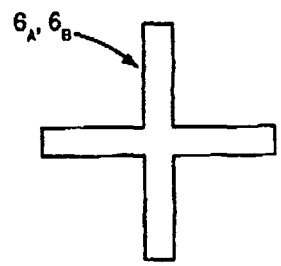

The shape of the measurement patterns $6_A$ and $6_B$ is to be understood merely as exemplary. Any other desired shapes are, of course, also possible, such as the examples shown in FIGS. 8 and 9, for example.

By comparison with previously known methods, the inventive method and the inventive device for determining the position of a first structure relative to a second structure or a part thereof can frequently evaluate larger image regions, as a result of which it is possible to improve the reproducibility and accuracy of the determination of position.

Figure 10:
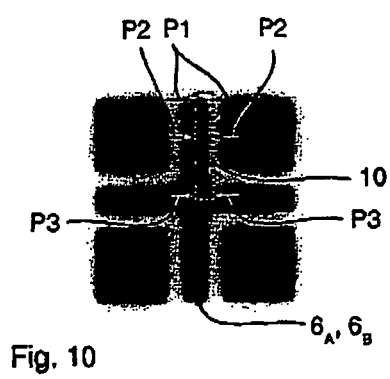
Figure 11:
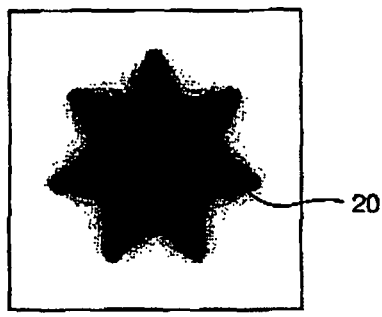
FIG. 11 shows a schematic of a double star structure.
Figure 12:
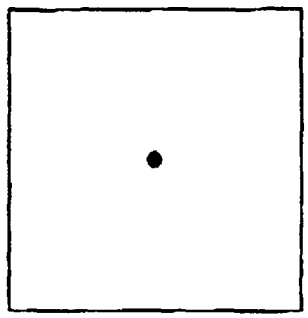
FIG. 12 shows the Fourier spectrum of the double star structure of FIG. 11.
Figure 13:
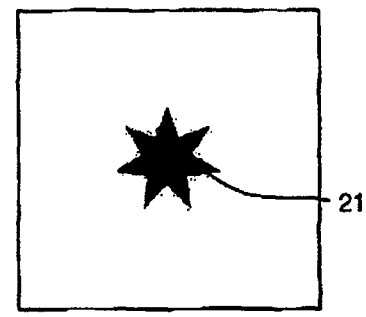
FIG. 13 shows a schematic of the masked inner star 21 of the double star structure 20 of FIG. 11.
Figure 14:
FIG. 14 shows the Fourier spectrum of the masked inner star in accordance with FIG. 13.

A cruciform structure as in FIG. 15 is shown in FIG. 10. However, the inventive method and the inventive device can, for example enable the masking 10 drawn in, in the case of which the edge trajectory of the weighting 10 is not homogeneous with reference to intensity. Moreover, the edge profile is also not homogeneous over the entire weighting range 10 in the way required, for example, for threshold value methods in the case of which two-dimensional edge profiles are evaluated, as a rule. As is indicated in FIG. 10 by the arrows P1, P2 and P3, the edge profile differs in these sections. Owing to the inventive method and the inventive device, it is therefore advantageously no longer necessary to select the masking such that the edge trajectory and the edge profile are homogeneous with reference to intensity. It is therefore possible to evaluate substantially larger image regions for the determination of the position of a first structure relative to a second structure or a part thereof.

The invention claimed is:

1. A method for determining the position of a first structure relative to a second structure or a part thereof, using a measuring device to perform the steps of:
   a) providing a first picture having a multiplicity of pixels and which contains the first structure,
   b) providing a second picture having a multiplicity of pixels and which contains the second structure,
   c) forming an optimization function with the displacement of the two pictures relative to one another as parameter, the optimization function overlaying the two pictures and masking the overlay such that in a determination of an extreme value of the optimization function a contribution is made only by the region of the overlay that corresponds to the second structure or the part thereof,
   d) ascertaining the extreme value of the optimization function and determining the optimal value of the displacement based on the extreme value of the optimization function, and
   e) determining the position of the first structure relative to the second structure or a part thereof with the optimal displacement value ascertained in step d).

2. The method as claimed in claim 1, in which the optimization function in accordance with step c) sums the squared difference of the brightness values of the two pictures in a weighted fashion over all the pixels, and the weighting is selected such that the masking of the region of the overlay corresponding to the second structure or the part thereof is effected.

3. The method as claimed in claim 1, in which in step c) the optimization function is formed such that it has as parameter the displacement of the first picture relative to the second picture.

4. The method as claimed in claim 1, in which the displacement in step c) is a cyclic displacement.

5. The method as claimed in claim 1, in which in step d) a stepwise displacement with subpixel steps is carried out for extreme value determination.

6. The method as claimed in claim 1, in which the masking is fixed relative to the second picture in the overlay.

7. The method as claimed in claim 1, in which the two pictures have the same number of pixels.

8. The method as claimed in claim 1, in which the optimization function has at least one further parameter that is taken into account in step d).

9. The method as claimed in claim 8, in which the at least one further parameter is a different activation of the two pictures, a rotation of the two pictures relative to one another and/or a brightness offset of the two pictures.

10. The method as claimed in claim 1, in which the first and second pictures are derived from the same picture.

11. The method as claimed in claim 1, in which the first and second pictures are respectively two-dimensional or three-dimensional pictures, and the displacement in accordance with step c) is a two-dimensional or three-dimensional displacement, respectively.

12. The method as claimed in claim 1, in which before step d) the position of the first structure relative to the second structure or a part thereof is determined with pixel accuracy, and the relative position determined with pixel accuracy is then taken into account in step d) in order to determine the relative position with subpixel accuracy with the aid of steps d) and e).

13. A device for determining the position of a first structure relative to a second structure or a part thereof, the device having an evaluation module that is provided with a first picture having a multiplicity of pixels and which contains the first structure, and with a second picture having a multiplicity of pixels and which contains the second structure, which evaluation module executes the following steps:
   A) forming an optimization function with the displacement of the two pictures relative to one another as parameter, the optimization function overlaying the two pictures and masking the overlay such that in a determination of an extreme value of the optimization function a contribution is made only by the region of the overlay that corresponds to the second structure or the part thereof,
   B) ascertaining the extreme value of the optimization function and determining the optimal value of the displacement based on the extreme value of the optimization function, and
   C) determining the position of the first structure relative to the second structure or a part thereof with the optimal displacement value ascertained in step B).

14. The device as claimed in claim 13, in which the optimization function in accordance with step A) sums the squared difference of the brightness values of the two pictures over all pixels in a weighted fashion, and the weighting is selected such that the masking of the region of the overlay corresponding to the second structure or the part thereof is effected.

15. The device as claimed in claim 13, in which the evaluation module forms the optimization function in step A) such that it has as parameter the displacement of the first picture relative to the second picture.

16. The device as claimed in claim 13, in which the displacement in step A) is a cyclic displacement.

17. The device as claimed in claim 13, in which in step B) a stepwise displacement with subpixel steps is carried out for extreme value determination.

18. The device as claimed in claim 13, in which the masking is fixed relative to the second picture in the overlay.

19. The device as claimed in claim 13, in which the optimization function has at least one further parameter that is taken into account in step B).

20. The device as claimed in claim 19, in which the at least one further parameter is a different activation of the two pictures, a rotation of the two pictures relative to one another and/or a brightness offset of the two pictures.

21. The device as claimed in claim 13, in which the first and second pictures are respectively two-dimensional or three-dimensional pictures, and the displacement in accordance with step A) is a two-dimensional or three-dimensional displacement, respectively.

* * * * *

UNITED STATES PATENT AND TRADEMARK OFFICE
CERTIFICATE OF CORRECTION

PATENT NO. : 8,693,805 B2  
APPLICATION NO. : 13/375830  
DATED : April 8, 2014  
INVENTOR(S) : Michael Arnz et al.

Page 1 of 1

It is certified that error appears in the above-identified patent and that said Letters Patent is hereby corrected as shown below:

In the Specification

Column 8

Lines 60-62 (approx.), delete "$\hat{B}_{m,n} \equiv \dfrac{B_{m,n}}{\sqrt{\sum_{m',n'} K_{m',n'} \cdot B^{2}_{m',n'}{}^{2}}}$"

and insert -- $\hat{B}_{m,n} \equiv \dfrac{B_{m,n}}{\sqrt{\sum_{m',n'} K_{m',n'} \cdot B_{m',n'}^{2}}}$ --.

Signed and Sealed this  
Fifteenth Day of July, 2014

Michelle K. Lee  
*Deputy Director of the United States Patent and Trademark Office*